US012804962B2

(12) United States Patent
Sato

(10) Patent No.: US 12,804,962 B2
(45) Date of Patent: Nov. 17, 2026

(54) SEMICONDUCTOR DEVICE AND METHOD FOR MANUFACTURING

(71) Applicants: Kabushiki Kaisha Toshiba, Tokyo (JP); Toshiba Electronic Devices & Storage Corporation, Tokyo (JP)

(72) Inventor: Shingo Sato, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 245 days.

(21) Appl. No.: 18/602,743

(22) Filed: Mar. 12, 2024

(65) Prior Publication Data

US 2025/0089306 A1 Mar. 13, 2025

(30) Foreign Application Priority Data

Sep. 11, 2023 (JP) ................................ 2023-147097

(51) Int. Cl.
*H10D 62/10* (2025.01)
*H10D 64/00* (2025.01)
*H10W 20/00* (2026.01)

(52) U.S. Cl.
CPC ......... *H10D 62/102* (2025.01); *H10D 62/124* (2025.01); *H10D 64/112* (2025.01); *H10W 20/089* (2026.01)

(58) Field of Classification Search
CPC .. H10D 62/102; H10D 62/124; H10D 64/112; H10D 30/0297; H10D 30/665;
(Continued)

(56) References Cited

U.S. PATENT DOCUMENTS 7,411,266 B2 8/2008 Tu et al.
7,892,924 B1 2/2011 Lee et al.
(Continued)

FOREIGN PATENT DOCUMENTS

JP 2002009083 A 1/2002
JP 2002353451 A 12/2002
(Continued)

OTHER PUBLICATIONS

Notice of Reasons for Refusal (Office Action) dated Jul. 21, 2026, mailed in counterpart Japanese Patent Application No. 2023-147097, with English machine translation, 16 pages.
(Continued)

*Primary Examiner* — Caleb E Henry
(74) *Attorney, Agent, or Firm* — Kim & Stewart LLP

(57) ABSTRACT

A semiconductor device includes an element region and a termination region. The semiconductor device includes a first electrode, a first semiconductor region, a second semiconductor region, a plurality of third semiconductor regions, a plurality of fourth semiconductor regions, a fifth semiconductor region, a sixth semiconductor region, a gate electrode, and a second electrode. The plurality of third semiconductor regions is arranged in a second direction. A pitch in the termination region of the plurality of third semiconductor regions increases away from the element region in the second direction. The plurality of fourth semiconductor regions is separated from the third semiconductor regions in the second direction. The plurality of fourth semiconductor regions is alternately arranged with the plurality of third semiconductor regions in the second direction.

8 Claims, 7 Drawing Sheets

(58) Field of Classification Search
CPC .. H10D 30/668; H10D 62/111; H10W 20/089
See application file for complete search history.

(56) References Cited

U.S. PATENT DOCUMENTS

| | | | | |
|---|---|---|---|---|
| 8,450,800 | B2 * | 5/2013 | Inomata | H10D 30/665 257/329 |
| 8,786,015 | B2 * | 7/2014 | Tamura | H10D 10/421 438/220 |
| 9,166,036 | B2 * | 10/2015 | Tamaki | H10D 12/461 |
| 9,559,171 | B2 * | 1/2017 | Naito | H10D 12/441 |
| 10,651,277 | B2 | 5/2020 | Abiko et al. | |
| 10,741,648 | B2 * | 8/2020 | Kosugi | H10D 12/031 |
| 10,749,022 | B2 | 8/2020 | Ono et al. | |
| 10,804,376 | B2 | 10/2020 | Takagi | |
| 10,818,771 | B2 | 10/2020 | Kawada | |
| 10,931,276 | B1 * | 2/2021 | Suh | H03K 17/0406 |
| 2005/0184336 | A1 * | 8/2005 | Takahashi | H10D 30/0291 257/E21.418 |
| 2006/0006458 | A1 * | 1/2006 | Motai | H10D 30/0291 257/E29.066 |
| 2006/0220156 | A1 * | 10/2006 | Saito | H10D 30/0291 257/E29.066 |
| 2007/0012998 | A1 * | 1/2007 | Miura | H10D 62/051 257/E29.026 |
| 2007/0029543 | A1 * | 2/2007 | Ninomiya | H10D 30/0297 257/E29.066 |
| 2008/0116512 | A1 * | 5/2008 | Kawaguchi | H10D 30/0295 257/334 |
| 2010/0059818 | A1 * | 3/2010 | Sasaki | H10D 30/0291 257/E29.256 |
| 2012/0153348 | A1 * | 6/2012 | Aono | H10D 12/038 438/135 |
| 2012/0273871 | A1 * | 11/2012 | Yedinak | H10D 30/0297 257/329 |
| 2012/0273875 | A1 * | 11/2012 | Yedinak | H10D 30/0297 438/270 |
| 2012/0273884 | A1 * | 11/2012 | Yedinak | H10D 30/0291 257/341 |
| 2012/0273916 | A1 * | 11/2012 | Yedinak | H10D 12/481 257/E29.338 |
| 2012/0276701 | A1 * | 11/2012 | Yedinak | H10D 30/0297 438/270 |
| 2013/0175607 | A1 | 7/2013 | Lee et al. | |
| 2014/0084361 | A1 * | 3/2014 | Saito | H10D 30/0291 257/329 |
| 2016/0276427 | A1 * | 9/2016 | Yamashita | H10D 30/668 |
| 2016/0276468 | A1 * | 9/2016 | Izumisawa | H10D 12/441 |
| 2016/0293693 | A1 * | 10/2016 | Niimura | H10D 30/665 |
| 2018/0286952 | A1 | 10/2018 | Abiko et al. | |
| 2019/0333988 | A1 | 10/2019 | Furuhashi et al. | |
| 2020/0243340 | A1 | 7/2020 | Mauder et al. | |
| 2022/0093475 | A1 | 3/2022 | Yokoyama et al. | |
| 2023/0246066 | A1 | 8/2023 | Liu et al. | |

FOREIGN PATENT DOCUMENTS

| | | | |
|---|---|---|---|
| JP | 2013140935 | A | 7/2013 |
| JP | 2018019053 | A | 2/2018 |
| JP | 2018174172 | A | 11/2018 |
| JP | 2019140258 | A | 8/2019 |
| JP | 2020502792 | A | 1/2020 |
| JP | 2020031222 | A | 2/2020 |
| JP | 2020047623 | A | 3/2020 |
| JP | 2020140994 | A | 9/2020 |
| JP | 2022051197 | A | 3/2022 |
| JP | 2022075117 | A | 5/2022 |
| JP | 2023502812 | A | 1/2023 |
| WO | 2018029951 | A1 | 2/2018 |
| WO | 2018111409 | A1 | 6/2018 |

OTHER PUBLICATIONS

Notice of Reasons for Refusal dated Sep. 25, 2026, mailed in counterpart Japanese Application No. 2023-147097, 12 pages.

* cited by examiner

SEMICONDUCTOR DEVICE AND METHOD FOR MANUFACTURING

CROSS-REFERENCE TO RELATED APPLICATIONS

This application is based upon and claims the benefit of priority from Japanese Patent Application No. 2023-147097, filed on Sep. 11, 2023; the entire contents of which are incorporated herein by reference.

FIELD

Embodiments relate to a semiconductor device and a method for manufacturing.

BACKGROUND

There is a semiconductor device that has a super junction structure (SJ structure) in which n-type semiconductor regions and p-type semiconductor regions are alternately arranged. The breakdown voltage of the semiconductor device can be increased by providing the SJ structure. The SJ structure may be located in an element region in which semiconductor elements such as transistors and the like are located, and in a termination region surrounding the element region. For example, there are cases where the breakdown voltage in the termination region degrades.

DETAILED DESCRIPTION

Figure 1:
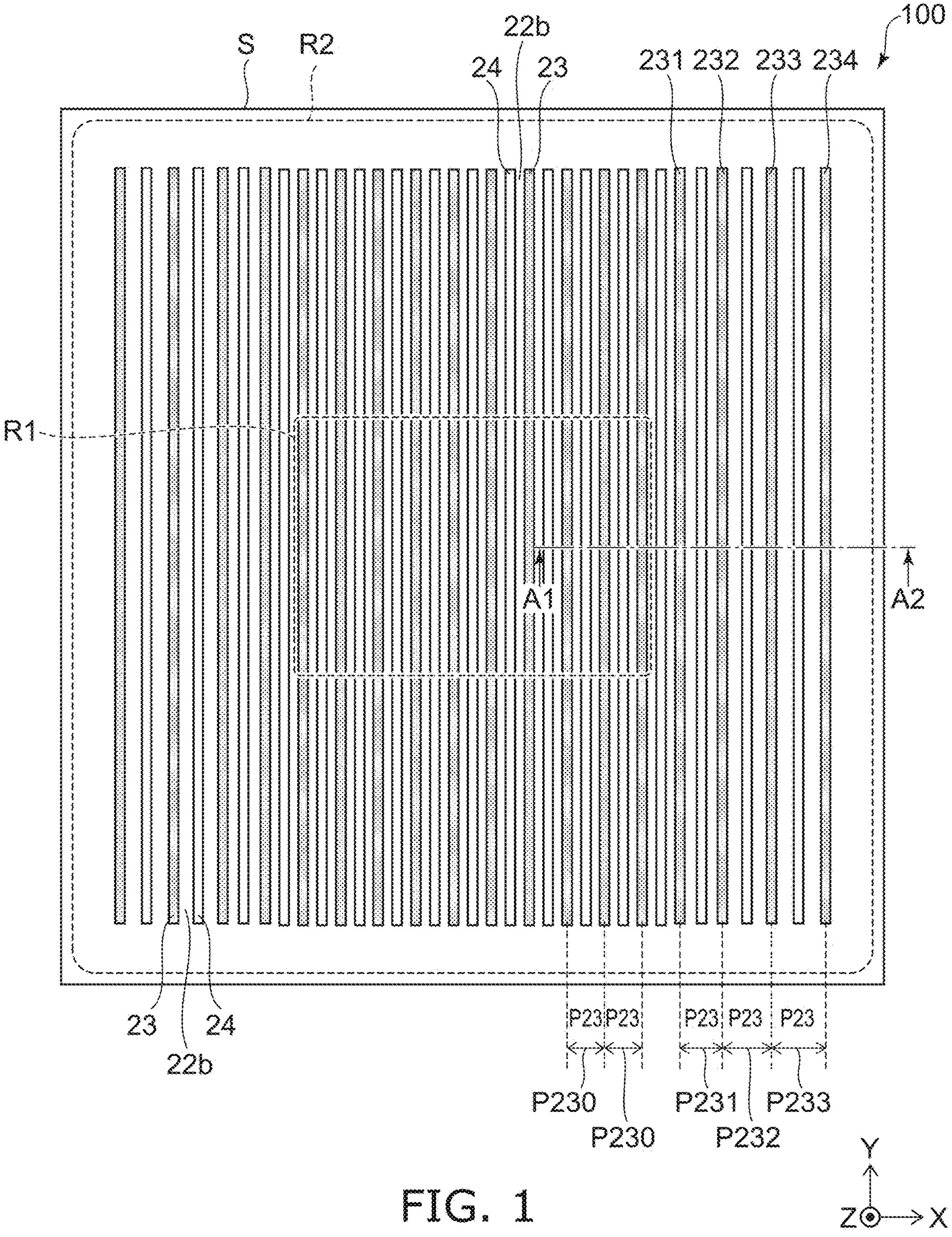
FIG. 1 is a schematic plan view illustrating a semiconductor device according to an embodiment.

A semiconductor device according to one embodiment, includes an element region and a termination region. The termination region surrounds the element region. The semiconductor device includes a first electrode, a first semiconductor region, a second semiconductor region, a plurality of third semiconductor regions, a plurality of fourth semiconductor regions, a fifth semiconductor region, a sixth semiconductor region, a gate electrode, and a second electrode. The first electrode is located in the element region and the termination region. The first semiconductor region is located on the first electrode. The first semiconductor region is of a first conductivity type. The second semiconductor region is located on the first semiconductor region. The second semiconductor region includes a first part and a plurality of second parts. The plurality of second parts is located on portions of the first part. The second semiconductor region is of the first conductivity type and has a lower first-conductivity-type impurity concentration than the first semiconductor region. The plurality of third semiconductor regions is located on other portions of the first part. The plurality of third semiconductor regions is arranged in a second direction perpendicular to a first direction. The first direction is from the first electrode toward the first semiconductor region. A pitch in the termination region of the plurality of third semiconductor regions increases away from the element region in the second direction. The plurality of third semiconductor regions is of a second conductivity type. The plurality of fourth semiconductor regions is separated from the third semiconductor regions in the second direction with the second parts interposed. The plurality of fourth semiconductor regions is alternately arranged with the plurality of third semiconductor regions in the second direction. The plurality of fourth semiconductor regions is of the first conductivity type and has a higher first-conductivity-type impurity concentration than the second semiconductor region. The fifth semiconductor region is located on at least one of the third semiconductor regions in the element region. The fifth semiconductor region is of the second conductivity type. The sixth semiconductor region is located on the fifth semiconductor region. The sixth semiconductor region is separated from the second part with a portion of the fifth semiconductor region interposed. The sixth semiconductor region is of the first conductivity type. The gate electrode faces the portion of the fifth semiconductor region via a gate insulating layer. The second electrode is located on the fifth and sixth semiconductor regions. The second electrode is electrically connected with the fifth and sixth semiconductor regions.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $n^{--}$, $p^+$, p, and $p^-$ indicate relative levels of the impurity concentrations. A notation marked with "+" indicates that the impurity concentration is relatively greater than that of a notation not marked with either "+" or "−"; and a notation marked with "−" indicates that the impurity concentration is relatively less than that of an unmarked notation. A notation marked with two "−" ("−−") indicates that the impurity concentration is relatively less than a notation marked with only one "−". When both a p-type impurity and an n-type impurity are included in each region, these notations indicate relative levels of the net impurity concentrations after the impurities are compensated. In the embodiments described below, each embodiment may be implemented by inverting the p-type (the second conductivity type) and the n-type (the first conductivity type) of each semiconductor region.

First Embodiment

FIG. 1 is a schematic plan view illustrating a semiconductor device according to an embodiment.

Figure 2:
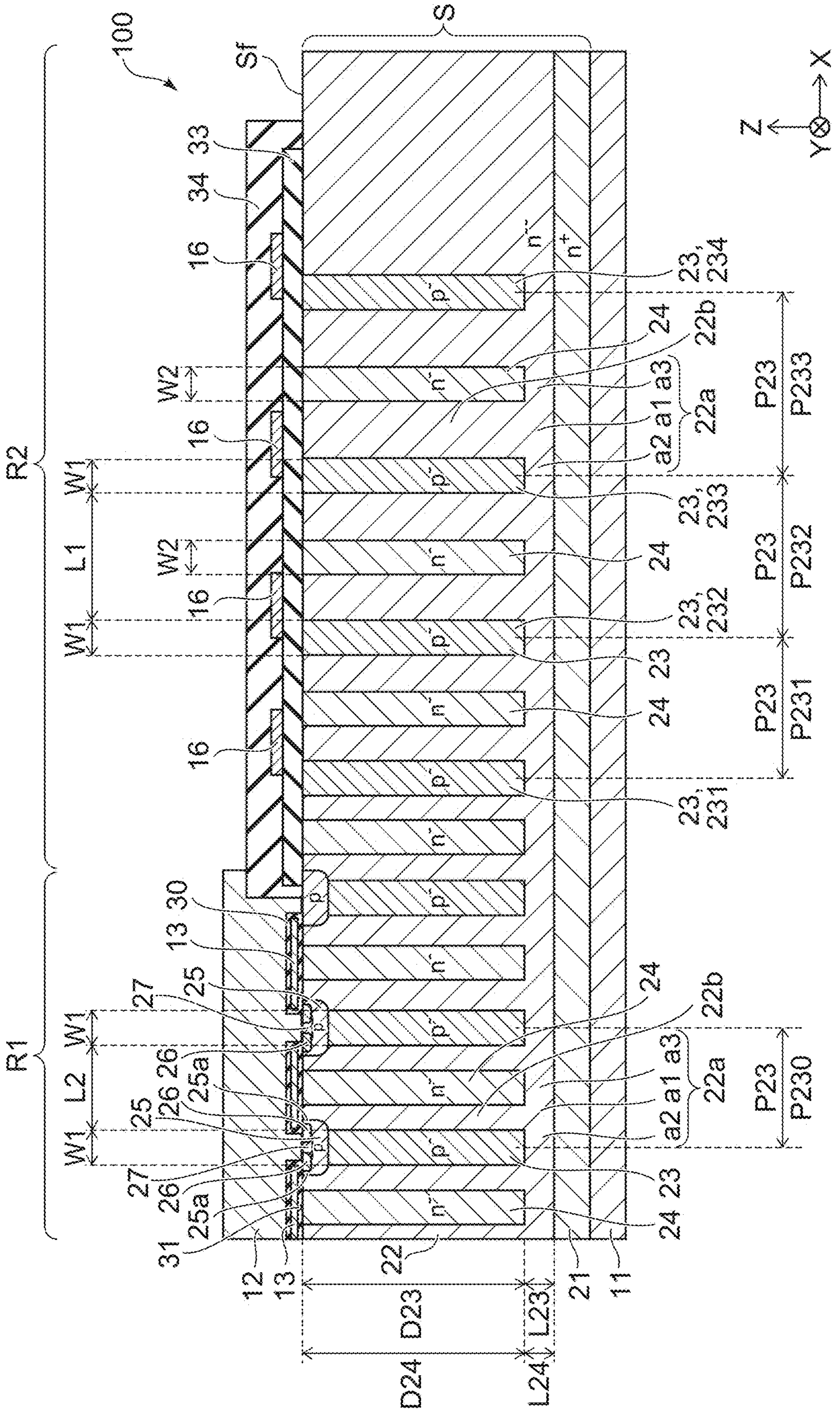
FIG. 2 is a schematic cross-sectional view illustrating the semiconductor device according to the embodiment.

FIG. 2 is a schematic cross-sectional view illustrating the semiconductor device according to the embodiment.

FIG. 2 illustrates a cross section along line A1-A2 shown in FIG. 1. In FIG. 1, the configuration of a portion of the semiconductor device 100 is not illustrated to describe the positional relationship of a third semiconductor region 23 and a fourth semiconductor region 24.

The semiconductor device according to the embodiment is, for example, a MOSFET (Metal-Oxide-Semiconductor Field Effect Transistor). As illustrated in FIG. 2, the semiconductor device 100 includes a drain electrode (a first electrode 11), an $n^+$-type drain region (a first semiconductor region 21), an $n^{--}$-type semiconductor region (a second semiconductor region 22), multiple $p^-$-type pillar regions (third semiconductor regions 23), multiple $n^-$-type pillar regions (fourth semiconductor regions 24), multiple p-type base regions (fifth semiconductor regions 25), multiple $n^+$-type source region (sixth semiconductor regions 26), multiple $p^+$-type contact regions (seventh semiconductor regions 27), a source electrode (a second electrode 12), multiple gate electrodes 13, and multiple insulating parts 30.

An XYZ orthogonal coordinate system is used in the description of embodiments. The direction from the first electrode 11 toward the first semiconductor region 21 is taken as a Z-direction (a first direction). Two mutually-orthogonal directions perpendicular to the Z-direction are taken as an X-direction (a second direction) and a Y-direction (a third direction). In the description, the direction from the first electrode 11 toward the first semiconductor region 21 is called "up/above/higher than", and the opposite direction is called "down/below/lower than". These directions are based on the relative positional relationship between the first electrode 11 and the first semiconductor region 21 and are independent of the direction of gravity.

An element region R1 and a termination region R2 are set in the semiconductor device 100. The element region R1 includes the fifth semiconductor region 25 and the sixth semiconductor region 26, and is a region in which semiconductor elements such as transistors and the like are formed. With respect to the element region R1, the termination region R2 is the outer region of a semiconductor substrate S in which the semiconductor regions are formed. As illustrated in FIG. 1, the termination region R2 surrounds the element region R1 in the X-Y plane.

As illustrated in FIG. 2, the first electrode 11 is located in the element region R1 and the termination region R2. The first semiconductor region 21 is located on the first electrode 11 in the element region R1 and the termination region R2. The first semiconductor region 21 contacts the upper surface of the first electrode 11 and is electrically connected with the first electrode 11. The first semiconductor region 21 is of the n-type.

The second semiconductor region 22 is located on the first semiconductor region 21 in the element region R1 and the termination region R2. The second semiconductor region 22 contacts the upper surface of the first semiconductor region 21 and is electrically connected with the first semiconductor region 21. For example, the second semiconductor region 22 is a semiconductor layer that is epitaxially grown on the first semiconductor region 21. The second semiconductor region 22 is of the n-type. The n-type impurity concentration ($atoms/cm^3$) of the second semiconductor region 22 is less than the n-type impurity concentration ($atoms/cm^3$) of the first semiconductor region 21.

The second semiconductor region 22 includes a first part 22*a* and multiple second parts 22*b*. The first part 22*a* and the second parts 22*b* are located in the element region R1 and the termination region R2. For example, the first part 22*a* is the part of the second semiconductor region 22 positioned lower than the third semiconductor regions 23. The second parts 22*b* are located on portions (portions a1) of the first part 22*a*.

The n-type impurity concentration ($atoms/cm^3$) of the second part 22*b* is equal to the n-type impurity concentration ($atoms/cm^3$) of the first part 22*a*. As an example, the n-type impurity concentration in the second semiconductor region 22 may be, for example, not less than $1\times10^{13}$ ($atoms/cm^3$) and not more than $1\times10^{15}$ ($atoms/cm^3$), and favorably not more than $8\times10^{14}$ ($atoms/cm^3$).

The multiple third semiconductor regions 23 are located in the element region R1 and the termination region R2. The multiple third semiconductor regions 23 are arranged in the X-direction; and each third semiconductor region 23 extends in the Y-direction. The third semiconductor regions 23 are located on other portions (portions a2) of the first part 22*a*. The third semiconductor regions 23 are arranged in the X-direction with the second parts 22*b*. The third semiconductor regions 23 contact the upper surfaces of portions (the portions a2) of the first part 22*a* and contact the side surfaces of the second parts 22*b*. A distance L23 (the distance along the Z-direction between the first semiconductor region 21 and the lower end of the third semiconductor region 23) illustrated in FIG. 2 is less than a distance D23 (the distance along the Z-direction between the lower end of the third semiconductor region 23 and an upper surface Sf of the semiconductor substrate S).

The third semiconductor region 23 is of the p-type; for example, the p-type impurity concentration ($atoms/cm^3$) of the third semiconductor region 23 is greater than the n-type impurity concentration ($atoms/cm^3$) of the second semiconductor region 22 (the first part 22*a* and the second parts 22*b*). As an example, the p-type impurity concentration in the third semiconductor region 23 may be, for example, not less than $1\times10^{15}$ ($atoms/cm^3$) and not more than $5\times10^{16}$ ($atoms/cm^3$).

For example, the p-type impurity concentrations (e.g., the peak concentrations) of the multiple third semiconductor regions 23 are equal between the element region R1 and the termination region R2. For example, widths W1 in the X-direction of the multiple third semiconductor regions 23 are equal between the element region R1 and the termination region R2. For example, the Z-direction positions of the lower ends of the multiple third semiconductor regions 23 are the same between the element region R1 and the termination region R2.

For example, in the element region R1, a pitch P23 of the multiple third semiconductor regions 23 is a constant pitch P230. In other words, in the element region R1, the multiple third semiconductor regions 23 are arranged in the X-direction at uniform spacing.

In this specification, the pitch refers to the distance along the X-direction between the X-direction centers of two adjacent components. For example, the pitch of the third semiconductor regions 23 is the distance along the X-direction between the X-direction center of one third semiconductor region 23 and the X-direction center of a third semiconductor region 23 adjacent to the one third semiconductor region 23.

The pitch P23 of the third semiconductor regions 23 in the termination region R2 increases away from the element region R1 in the X-direction. More specifically, in the example illustrated in FIG. 2, a pitch P232 between a region 232 and a region 233 is greater than a pitch P231 between a region 231 and the region 232. A pitch P233 between a region 234 and the region 233 is greater than the pitch P232. The regions 231 to 234 each are one of the third semiconductor regions 23. The region 233 is positioned between the element region R1 and the region 234. The region 232 is positioned between the element region R1 and the region 233. The region 231 is positioned between the element region R1 and the region 232.

The multiple fourth semiconductor regions 24 are located in the element region R1 and the termination region R2. The multiple fourth semiconductor regions 24 are arranged in the X-direction; and each fourth semiconductor region 24 extends in the Y-direction. At least some of the fourth semiconductor regions 24 are arranged in the X-direction with the third semiconductor regions 23. The multiple fourth semiconductor regions 24 and the multiple third semiconductor regions 23 are alternately arranged in the X-direction. The second part 22*b* of the second semiconductor region 22 is positioned between the third semiconductor region 23 and the fourth semiconductor region 24. Therefore, the fourth semiconductor regions 24 are separated from the third semiconductor regions 23 in the X-direction with the second parts 22*b* interposed, and do not contact the third semiconductor regions 23. For example, each fourth semiconductor region 24 is located at the X-direction center between adjacent third semiconductor regions 23.

The fourth semiconductor regions 24 are located on portions (portions a3) of the second semiconductor region 22. The fourth semiconductor regions 24 contact the upper surfaces of the portions a3 and contact the side surfaces of the second parts 22*b*. A distance L24 (the distance along the Z-direction between the first semiconductor region 21 and the lower end of the fourth semiconductor region 24) illustrated in FIG. 2 is less than a distance D24 (the distance along the Z-direction between the lower end of the fourth semiconductor region 24 and the upper surface Sf of the semiconductor substrate S).

The fourth semiconductor region 24 is of the n-type. The n-type impurity concentration (atoms/$cm^3$) of the fourth semiconductor region 24 is greater than the n-type impurity concentration of the second semiconductor region 22 (the first part 22*a* and the second parts 22*b*). The n-type impurity concentration of the fourth semiconductor region 24 is less than the n-type impurity concentration of the first semiconductor region 21. As an example, the n-type impurity concentration of the fourth semiconductor region 24 may be, for example, not less than $1\times10^{15}$ (atoms/$cm^3$) and not more than $5\times10^{16}$ (atoms/$cm^3$).

For example, the n-type impurity concentrations (e.g., the peak concentrations) of the multiple fourth semiconductor regions 24 are equal between the element region R1 and the termination region R2. For example, widths W2 in the X-direction of the multiple fourth semiconductor regions 24 are equal between the element region R1 and the termination region R2. For example, the Z-direction positions of the lower ends of the multiple fourth semiconductor regions 24 are equal between the element region R1 and the termination region R2. The width W2 of the fourth semiconductor region 24 may be equal to the width W1 of the third semiconductor region 23. Or, the width W2 of the fourth semiconductor region 24 may be greater or less than the width W1 of the third semiconductor region 23.

Thus, a structure in which one second part 22*b*, the third semiconductor region 23, another one second part 22*b*, and the fourth semiconductor region 24 are arranged in this order is repeatedly arranged along the X-direction. In other words, two second parts 22*b* are located between two mutually-adjacent third semiconductor regions 23; and one fourth semiconductor region 24 is located between the two second parts 22*b*. The p-type third semiconductor region 23 and the n-type second semiconductor region 22 and fourth semiconductor region 24 form a super junction structure (a SJ structure) in which p-n junctions are repeatedly provided in the X-direction.

As illustrated in FIG. 2, the width W1 in the X-direction of the third semiconductor region 23 in the element region R1 may be less than a distance L2 between the mutually-adjacent third semiconductor regions 23 in the element region R1. The configuration is not limited thereto; for example, the width W1 may be equal to the distance L2. In the element region R1, for example, the total amount of the n-type impurity and the total amount of the p-type impurity are adjusted to be substantially equal for an n-type region (one fourth semiconductor region 24 and two second parts 22*b*) and one third semiconductor region 23 adjacent to the n-type region, wherein the n-type region is located between two third semiconductor regions 23. The peak concentration (atoms/$cm^3$) of the p-type impurity in the third semiconductor region 23 may be not less than the peak concentration (atoms/$cm^3$) of the n-type impurity in the fourth semiconductor region 24. Or, the peak concentration (atoms/$cm^3$) of the p-type impurity in the third semiconductor region 23 may be not more than the peak concentration (atoms/$cm^3$) of the n-type impurity in the fourth semiconductor region 24.

In the element region R1, the fifth semiconductor region 25 is located on one third semiconductor region 23 and is electrically connected with the third semiconductor region 23. The multiple fifth semiconductor regions 25 are arranged in the X-direction; and each fifth semiconductor region 25 extends in the Y-direction. The fifth semiconductor region 25 is of the p-type; and the p-type impurity concentration of the fifth semiconductor region 25 is greater than the p-type impurity concentration of the third semiconductor region 23. A portion of the fourth semiconductor region 24 (or the second semiconductor region 22) is located between two adjacent fifth semiconductor regions 25.

In the element region R1, the sixth semiconductor region 26 is located on a portion of the fifth semiconductor region 25. The multiple sixth semiconductor regions 26 are arranged in the X-direction; and each sixth semiconductor region 26 extends in the Y-direction. The sixth semiconductor region is of the n-type; and the n-type impurity concentration of the sixth semiconductor region 26 is greater than the n-type impurity concentration of the fourth semiconductor region 24. The sixth semiconductor region 26 is separated from the second part 22*b* with a portion of the fifth semiconductor region 25 interposed. A portion of the fifth semiconductor region 25 (a portion that includes a region 25*a* in which a channel is formed) is positioned between the sixth semiconductor region 26 and an n-type region (the fourth semiconductor region 24 or the second semiconductor region 22).

In the example, two sixth semiconductor regions 26 are located on one fifth semiconductor region 25. The seventh semiconductor region 27 is located on the fifth semiconductor region 25 between the two sixth semiconductor regions 26. The seventh semiconductor region 27 is of the p-type; and the p-type impurity concentration of the seventh semiconductor region 27 is greater than the p-type impurity concentration of the fifth semiconductor region 25.

The multiple gate electrodes 13 and a gate insulating layer 31 are located in the element region R1. The multiple gate electrodes 13 are arranged in the X-direction; and each gate electrode 13 extends in the Y-direction. The gate electrode 13 faces the fifth semiconductor region 25 via the gate insulating layer 31. More specifically, the gate electrode 13 is positioned on the region 25*a*, a portion of the sixth semiconductor region 26 adjacent to the region 25*a*, and a portion of the n-type region adjacent to the region 25*a*. The gate insulating layer 31 is positioned between the gate electrode 13 and the region 25*a* (and the portion of the sixth semiconductor region 26 and the portion of the n-type region).

The second electrode 12 is located in the element region R1. The second electrode 12 is located on the fifth semiconductor region 25 (on the seventh semiconductor region 27) and on the sixth semiconductor region 26. The second electrode 12 contacts the sixth semiconductor region 26 and is electrically connected with the sixth semiconductor region 26. The second electrode 12 contacts the seventh semiconductor region 27 and is electrically connected with the fifth semiconductor region 25 via the seventh semiconductor region 27.

In the termination region R2 as illustrated in FIG. 2, an insulating layer 33, an insulating layer 34, and multiple conductive parts 16 are located on the semiconductor substrate S. The insulating layer 33 is located on the multiple third semiconductor regions 23 and the second semiconductor region 22 (and the fourth semiconductor regions 24) located in the termination region R2. The multiple conductive parts 16 are arranged in the X-direction on the insulating layer 33; and each conductive part 16 extends in the Y-direction. Each conductive part 16 is positioned above a junction interface between the third semiconductor region 23 and the second semiconductor region 22 with the insulating layer 33 interposed. The conductive part 16 is, for example, a field plate electrode. The potential of the conductive part 16 is, for example, floating. By including the field plate electrode, for example, the electric field intensity of the junction interface between the third semiconductor region 23 and the second semiconductor region 22 is suppressed. For example, the depletion layer in the termination region R2 is prevented from reaching the outer perimeter of the termination region R2. The insulating layer 34 is located on the insulating layer 33 and the conductive parts 16 and covers the insulating layer 33 and the conductive parts 16.

Examples of the materials of the components will now be described.

The first semiconductor region 21, the second semiconductor region 22, the third semiconductor region 23, the fourth semiconductor region 24, the fifth semiconductor region 25, the sixth semiconductor region 26, and the seventh semiconductor region 27 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate electrode 13 and the conductive part 16 include conductive materials such as polysilicon, etc. Impurities may be added to the conductive materials. The gate insulating layer 31, the insulating part 30, the insulating layer 33, and the insulating layer 34 include insulating materials such as silicon oxide, silicon nitride, etc. The first electrode 11 and the second electrode 12 include metals such as aluminum, titanium, etc.

Operations of the semiconductor device 100 will now be described.

For example, a positive voltage with respect to the second electrode 12 is applied to the first electrode 11. When a voltage that is greater than a threshold is applied to the gate electrode 13 in this state, an n-type inversion layer is formed in the fifth semiconductor region 25 (the region 25*a*). As a result, an on-state is obtained in which electrons flow from the second electrode 12 toward the first electrode 11 via the sixth semiconductor region 26, the fifth semiconductor region 25 (the region 25*a*), the second semiconductor region 22, and the first semiconductor region 21. When the voltage applied to the gate electrode 13 becomes the threshold or less, an off-state is obtained in which the n-type inversion layer is not formed in the fifth semiconductor region 25 (the region 25*a*); and electrons substantially do not flow from the second electrode 12 toward the first electrode 11. When the MOSFET is in the off-state and a positive voltage with respect to the second electrode 12 is applied to the first electrode 11, a depletion layer spreads in the second and third semiconductor regions 22 and 23 from the p-n junction surface between the second semiconductor region 22 (the second part 22*b*) and the third semiconductor region 23. As a result, electric field concentration is suppressed, and a high breakdown voltage is obtained.

An example of a method for manufacturing the semiconductor device according to the embodiment will now be described.

FIGS. 3A, 3B, 4A, 4B, 5A, 5B, 6A, and 6B are cross-sectional views illustrating the method for manufacturing the semiconductor device according to the embodiment.

Figure 3A:
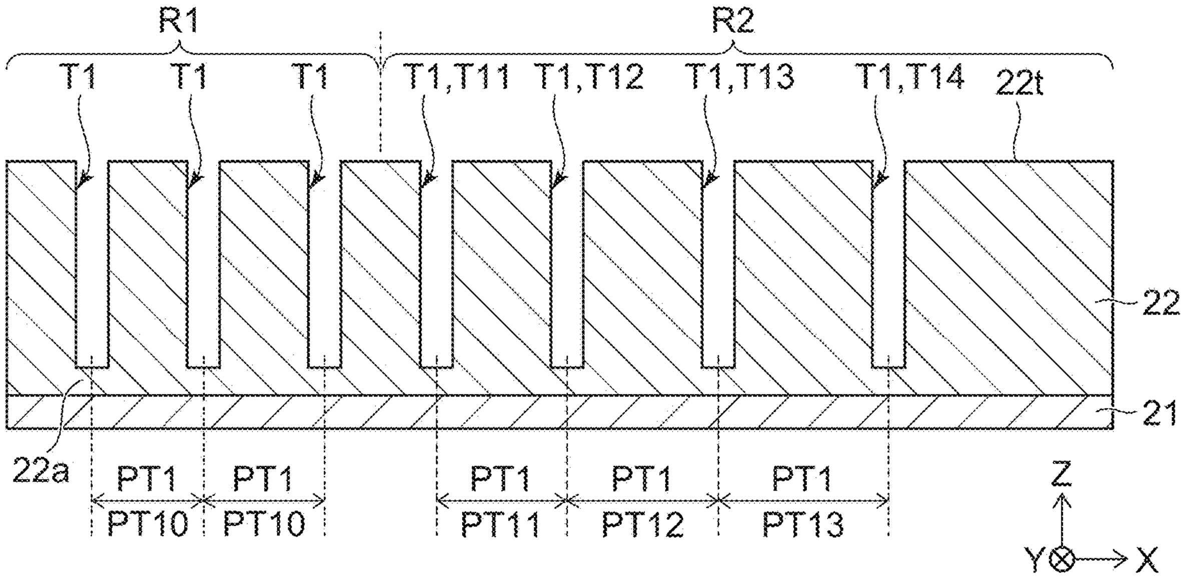
FIGS. 3A and 3B are cross-sectional views illustrating a method for manufacturing the semiconductor device according to the embodiment.

First, an n-type semiconductor substrate that is used to form the first semiconductor region 21 is prepared. The second semiconductor region 22 is epitaxially grown on the n-type semiconductor substrate (the first semiconductor region 21). Subsequently, as illustrated in FIG. 3A, first trenches T1 are formed in an upper surface 22*t* of the second semiconductor region 22. For example, a portion of the second semiconductor region 22 is removed from the upper surface 22*t* side by reactive ion etching (RIE). The multiple first trenches T1 are arranged in the X-direction; and each first trench T1 extends in the Y-direction. The part of the second semiconductor region 22 positioned lower than the lower ends of the first trenches T1 corresponds to the first part 22*a*.

Figure 3B:
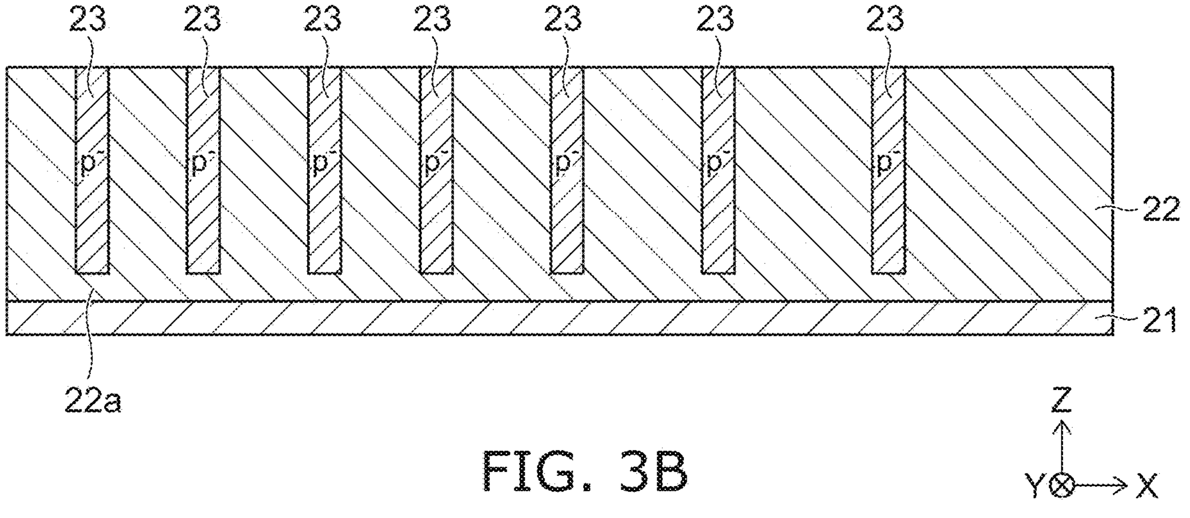

Subsequently, as illustrated in FIG. 3B, the third semiconductor regions 23 are formed in the first trenches T1. For example, a p-type semiconductor layer that is used to form the third semiconductor regions 23 is epitaxially grown in the first trenches T1. The position of the upper surface of the p-type semiconductor layer is caused to recede by polishing and planarizing the upper surface. As a result, as illustrated in FIG. 3B, the third semiconductor regions 23 are filled into the first trenches T1.

Thus, the third semiconductor regions 23 are formed to correspond to the first trenches T1. Accordingly, the width and pitch relationships of the first trenches T1 are similar to the width and pitch relationships of the third semiconductor regions 23.

In other words, for example, as illustrated in FIG. 3A, in the area used to form the element region R1, a pitch PT1 of the multiple first trenches T1 is a constant pitch PT10. On the other hand, in the area used to form the termination region R2, the pitch PT1 of the first trenches T1 increases away from the element region R1 in the X-direction. More specifically, in the example illustrated in FIG. 3A, a pitch PT12 between a trench part T12 and a trench part T13 is greater than a pitch PT11 between a trench part T11 and the trench part T12. A pitch PT13 between a trench part T14 and the trench part T13 is greater than the pitch PT12. The trench parts T11 to T14 each are one first trench T1. The trench part T13 is positioned between the element region R1 and the trench part T14. The trench part T12 is positioned between the element region R1 and the trench part T13. The trench part T11 is positioned between the element region R1 and the trench part T12. The width (the length along the X-direction) of the first trench T1 is constant.

Figure 4A:
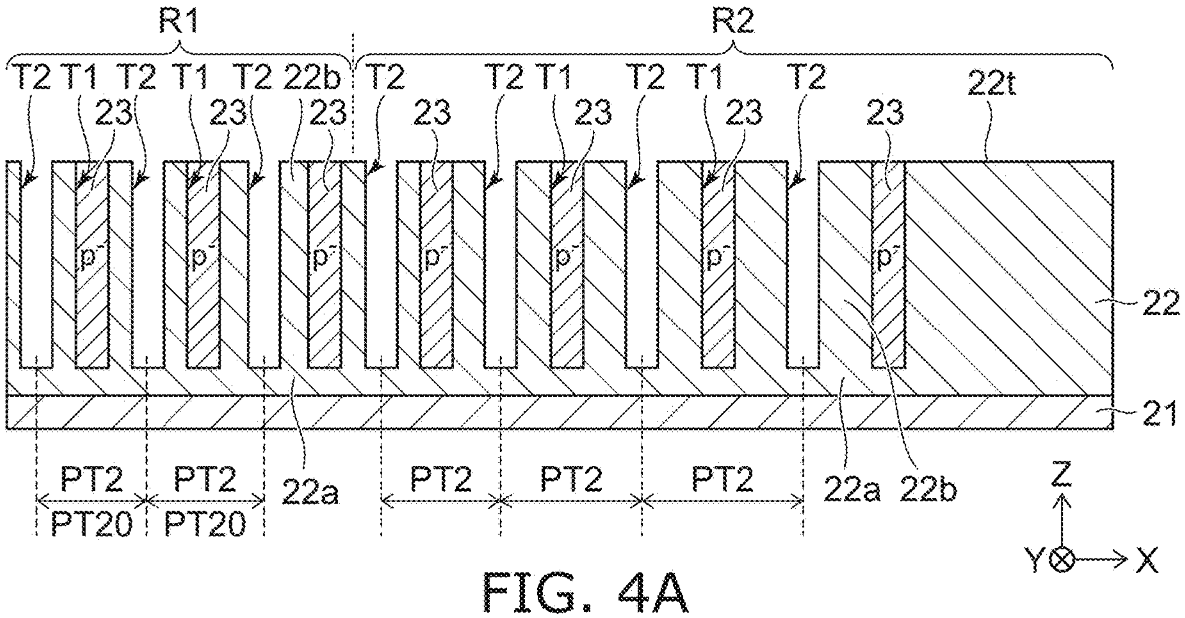
FIGS. 4A and 4B are cross-sectional views illustrating the method for manufacturing the semiconductor device according to the embodiment.

As illustrated in FIG. 4A, second trenches T2 are formed in the upper surface 22*t* of the second semiconductor region 22. For example, a portion of the second semiconductor region 22 is removed from the upper surface 22*t* side by reactive ion etching. The multiple second trenches T2 are arranged in the X-direction; and each second trench T2 extends in the Y-direction. The second trench T2 is positioned between two adjacent first trenches T1. In other words, the multiple second trenches T2 are alternately arranged in the X-direction with the positions at which the multiple first trenches T1 are located. The part of the second semiconductor region 22 between the first trench T1 and the second trench T2 corresponds to the second part 22*b*. The second trench T2 may extend through the second semiconductor region 22.

Figure 4B:
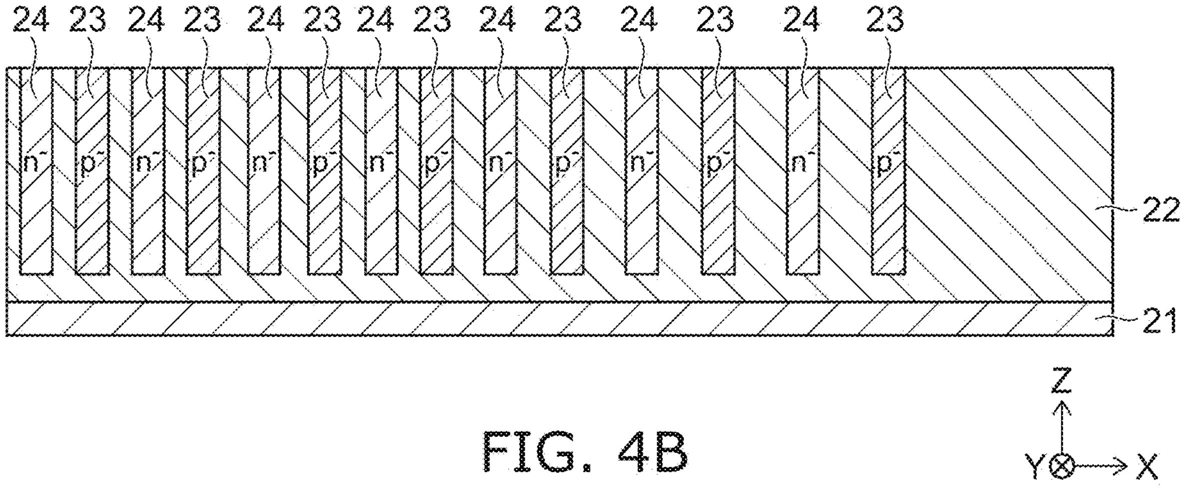

Subsequently, as illustrated in FIG. 4B, the fourth semiconductor regions 24 are formed in the second trenches T2. For example, an n-type semiconductor layer that is used to form the fourth semiconductor regions 24 is epitaxially grown in the second trenches T2. The position of the upper surface of the n-type semiconductor layer is caused to recede by polishing and planarizing the upper surface. As a result, as illustrated in FIG. 4B, the fourth semiconductor regions 24 are filled into the second trenches T2.

Thus, the fourth semiconductor regions 24 are formed to correspond to the second trenches T2. Accordingly, the width and pitch relationships of the second trenches T2 are similar to the width and pitch relationships of the fourth semiconductor regions 24. In other words, for example, as illustrated in FIG. 4A, in the area used to form the element region R1, a pitch PT2 of the multiple second trenches T2 is a constant pitch PT20. On the other hand, in the area used to form the termination region R2, the pitch PT2 of the second trenches T2 increases away from the element region R1 in the X-direction. The width (the length along the X-direction) of the second trench T2 is constant. The width of the second trench T2 may be equal to the width of the first trench T1. Or, the width of the second trench T2 may be greater or less than the width of the first trench T1.

Figure 5A:
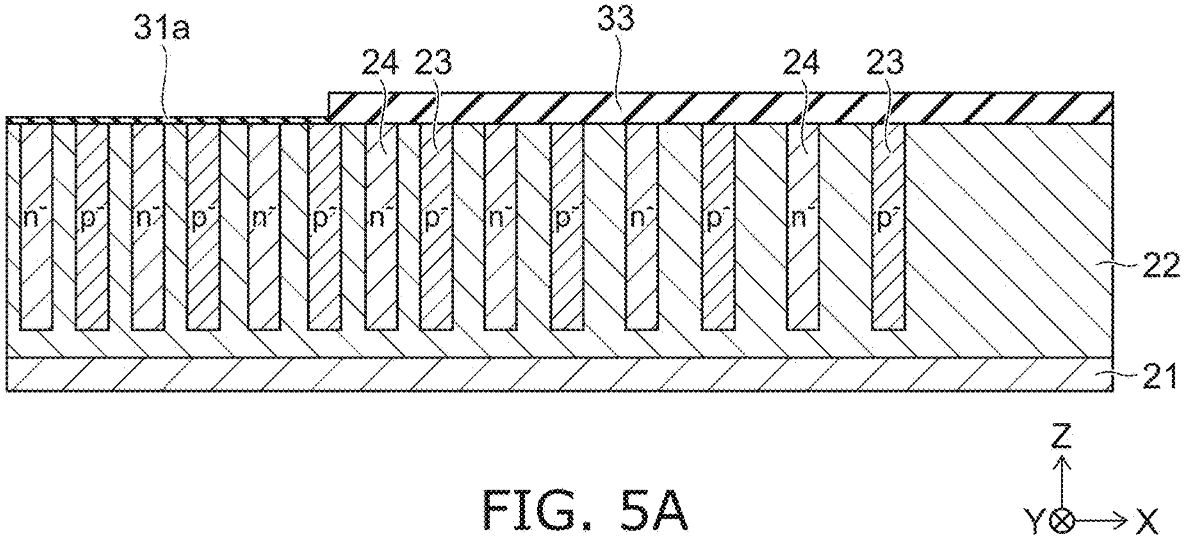
FIGS. 5A and 5B are cross-sectional views illustrating the method for manufacturing the semiconductor device according to the embodiment.

Subsequently, as illustrated in FIG. 5A, an insulating layer that is used to form the insulating layer 33 is formed by, for example, chemical vapor deposition (CVD) on the upper surfaces of the second, third, and fourth semiconductor regions 22, 23, and 24. For example, an opening is made by RIE in the portion of the insulating layer used to form the element region R1. An insulating layer 31*a* that is used to form the gate insulating layer 31 is formed by, for example, thermal oxidation in the area used to form the element region R1.

Figure 5B:
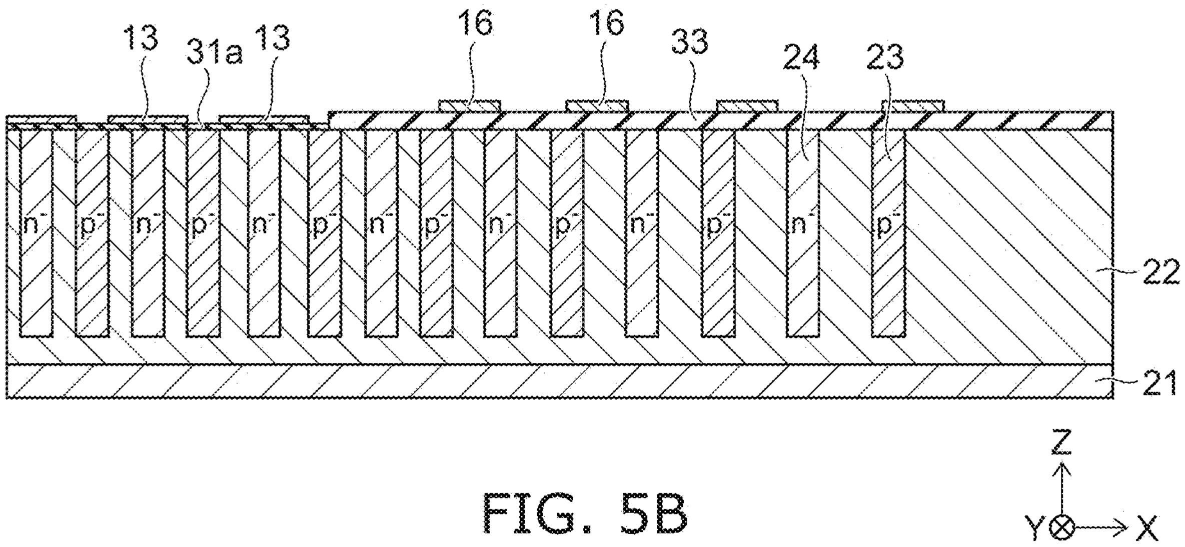

As illustrated in FIG. 5B, the conductive layers are formed on the insulating layers 33 and 31*a* by, for example, depositing a conductive material (polysilicon) by CVD. The gate electrodes 13 and the conductive parts 16 are formed by patterning the conductive layer.

Figure 6A:
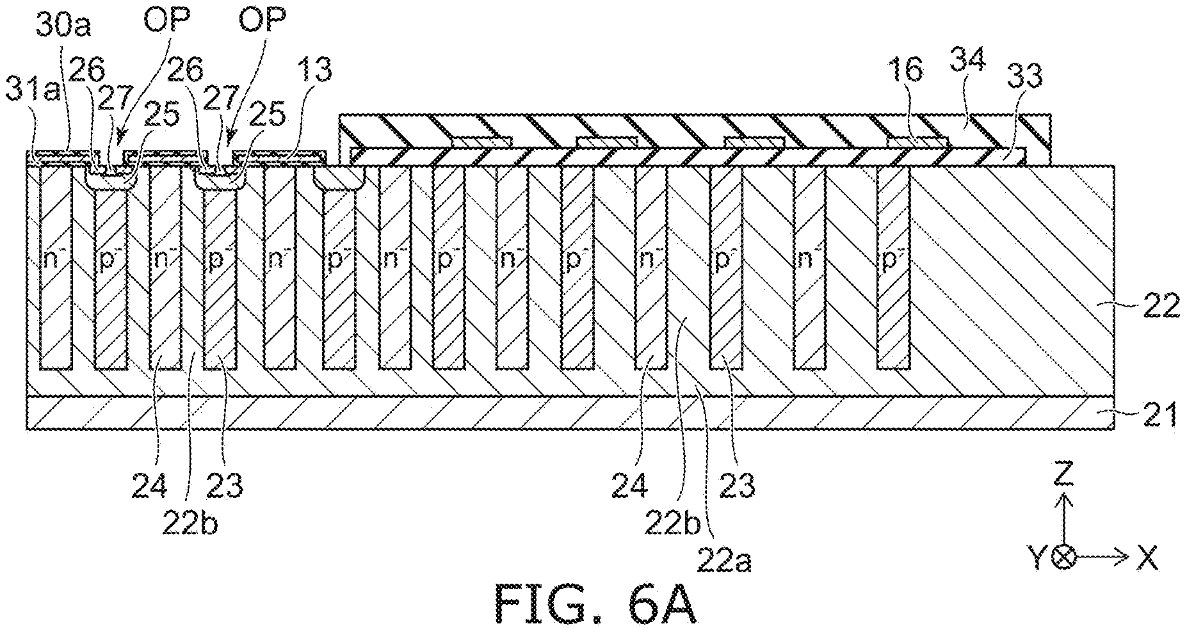
FIGS. 6A and 6B are cross-sectional views illustrating the method for manufacturing the semiconductor device according to the embodiment.

Subsequently, an interlayer film that is used to form the insulating layer 34 illustrated in FIG. 6A is formed by, for example, oxidizing polysilicon. The interlayer film covers the insulating layer 33, the conductive parts 16, and the gate electrodes 13. After forming a resist on the interlayer film, openings are formed by lithography in the portions of the resist positioned above the regions between the gate electrodes 13; and the interlayer film is patterned by RIE. As a result, openings OP are formed between the gate electrodes 13. The openings OP extend through the insulating layer 31*a* and an interlayer film (an insulating layer 30*a*). The second semiconductor region 22 and the fourth semiconductor region 24 around the gate electrode 13 are covered with the insulating layers 31*a* and 30*a*.

A p-type impurity is ion-implanted via the openings OP into the upper surfaces of the third semiconductor regions 23 located in the element region R1. The fifth semiconductor regions 25 are formed thereby. The sixth semiconductor regions 26 and the seventh semiconductor regions 27 are formed by sequentially ion-implanting an n-type impurity and a p-type impurity into the upper surfaces of the fifth semiconductor regions 25.

Figure 6B:
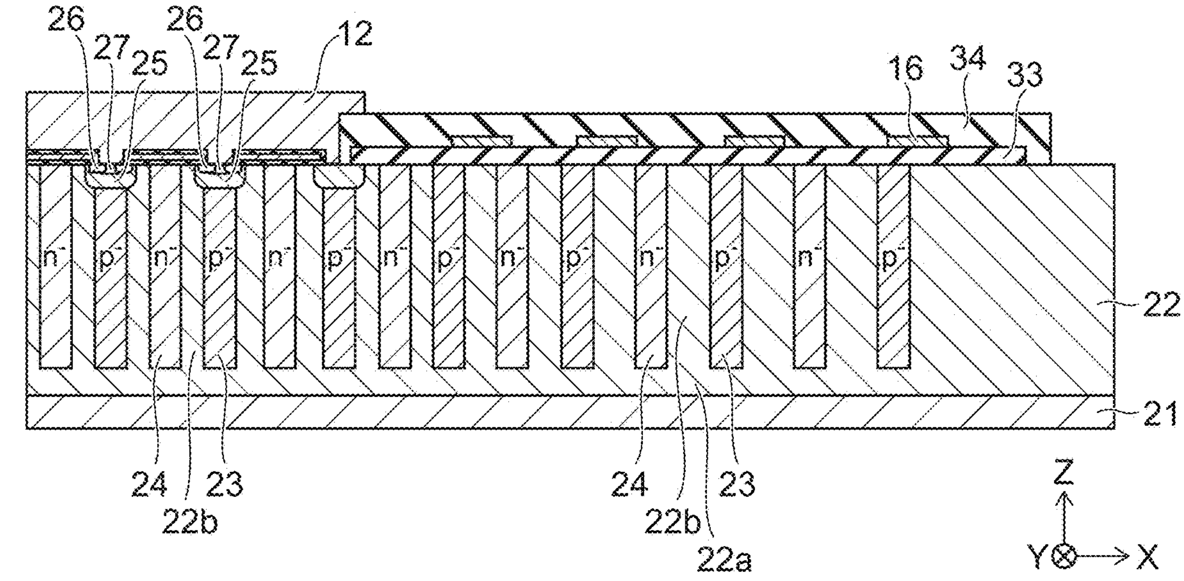

As illustrated in FIG. 6B, a metal layer is formed by sputtering to cover the insulating layers 30*a*. The second electrode 12 is formed in the element region R1 by patterning the metal layer.

Subsequently, the back surface of the first semiconductor region 21 is polished as necessary. The first electrode 11 is formed at the back surface of the first semiconductor region 21 by sputtering.

The semiconductor device 100 according to the embodiment is manufactured by the processes described above. The order of the processes described above may be modified as appropriate to the extent possible. For example, the order of forming and filling the first trench T1 and the second trench T2 may be the reverse of that described above. For example, the fifth semiconductor region 25, the sixth semiconductor region 26, and the seventh semiconductor region 27 may be formed before forming the gate insulating layer 31 and the gate electrode 13.

Effects of the embodiment will now be described.

In the semiconductor device 100 according to the embodiment, the second part 22*b* of the n-type second semiconductor region 22 that has a relatively low impurity concentration is located between the n-type fourth semiconductor region 24 and the p-type third semiconductor region 23 that have relatively high impurity concentrations. In other words, direct contact between an n-type semiconductor region having a high impurity concentration and a p-type semiconductor region having a high impurity concentration is suppressed. Therefore, a high electric field intensity at the p-n junction can be suppressed, and the breakdown voltage of the semiconductor device can be increased.

In the SJ structure, for example, from the perspective of maintaining the breakdown voltage, the p-type semiconductor impurity amount and the n-type semiconductor impurity amount are set to match in the element region. Here, for example, in the SJ structure of a reference example in which an n-type pillar and a p-type pillar are alternately arranged to contact each other, the impurity concentration balance is adjusted using the impurity concentration of the n-type pillar and the impurity concentration of the p-type pillar. In the SJ structure of such a reference example, the amounts of the p-type impurity and the n-type impurity that cancel each other is high because the p-type semiconductor region and the n-type semiconductor region have high impurity concentrations and are proximate to each other. In such a case, the breakdown voltage may greatly degrade when the impurity amount balance changes in the element region. In contrast, according to the embodiment, the widths of the fourth semiconductor region 24 (the n-type pillar) and the third semiconductor region 23 (the p-type pillar) and the impurity concentration and width of the second part 22*b* can be changed. The design degree of freedom is increased because the adjustable parameters are increased.

According to the embodiment, the pitch P23 of the third semiconductor regions 23 in the termination region R2 increases away from the element region R1. Therefore, in the termination region R2, the n-type impurity amount relatively increases outward. In such a case, the depletion layer that extends from the element region R1 toward the outer perimeter of the termination region R2 is prevented from extending to the outermost third semiconductor region 23. An increase of the electric field intensity at the region of the outermost perimeter of the termination region R2 is suppressed thereby. The degradation of the breakdown voltage in the termination region R2 can be suppressed, and the degradation of the breakdown voltage of the semiconductor device 100 can be suppressed. This is described with reference to FIGS. 7A to 7D.

FIGS. 7A to 7D are schematic cross-sectional views illustrating a simulation of semiconductor device characteristics.

Figure 7A:
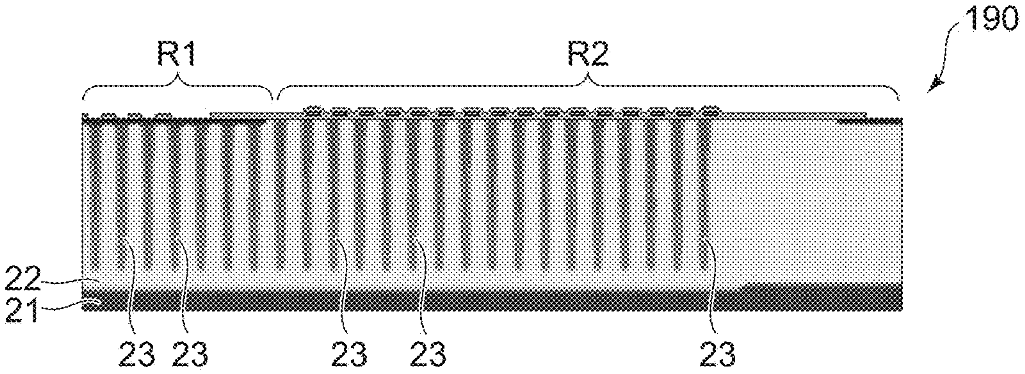
FIGS. 7A to 7D are schematic cross-sectional views illustrating a simulation of semiconductor device characteristics.
Figure 7B:
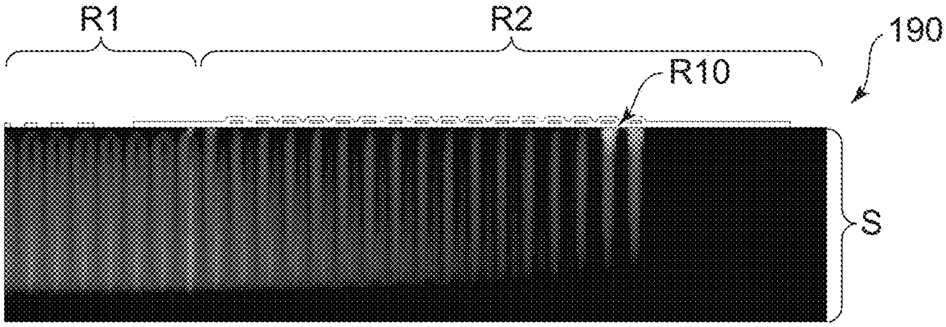

FIG. 7A is a schematic cross-sectional view illustrating a semiconductor device 190 used in the simulation. In the semiconductor device 190 as illustrated in FIG. 7A, the multiple third semiconductor regions 23 are provided in the n-type second semiconductor region 22 to be arranged in the X-direction. In the semiconductor device 190, the pitch of the third semiconductor regions 23 is constant in the element region R1 and the termination region R2. FIG. 7B illustrates the impact ionization rate distribution in the semiconductor device 190 in the off-state when a positive voltage is applied to the drain side.

Figure 7C:
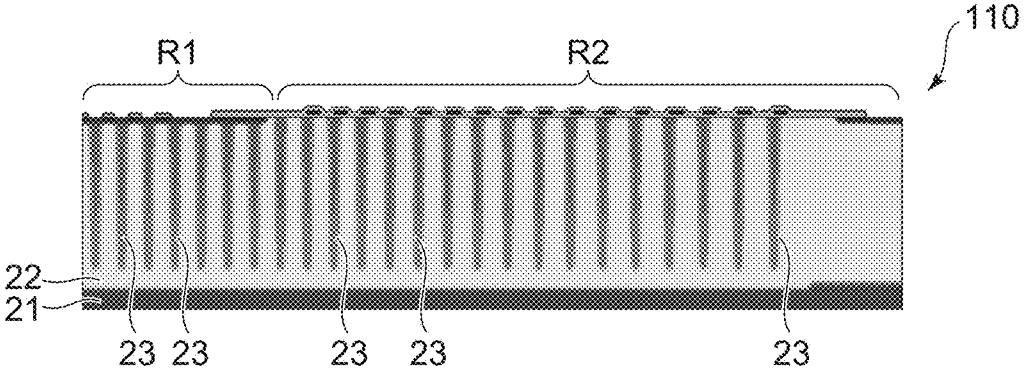
Figure 7D:
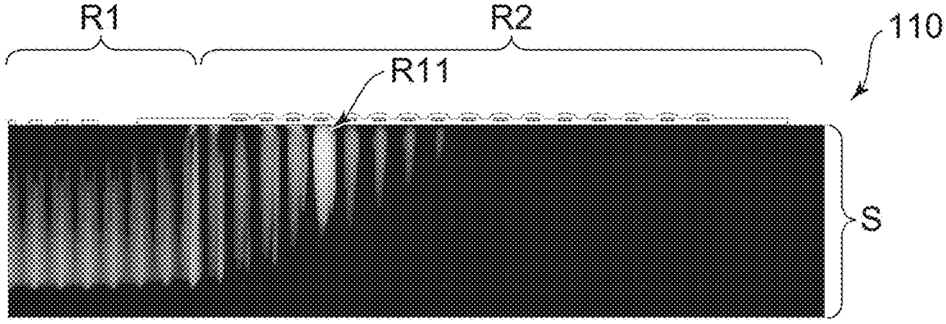

FIG. 7C is a schematic cross-sectional view illustrating a semiconductor device 110 used in the simulation. As illustrated in FIG. 7C, in the semiconductor device 110 as well, the multiple third semiconductor regions 23 are provided in the n-type second semiconductor region 22 to be arranged in the X-direction. In the semiconductor device 110, the pitch of the third semiconductor regions 23 is constant in the element region R1; and the pitch of the third semiconductor regions 23 in the termination region R2 increases away from the element region R1. More specifically, the pitch of the third semiconductor regions 23 increases 1.02 times per pitch away from the element region R1. FIG. 7D illustrates the impact ionization rate distribution of the semiconductor device 110 in the off-state when a positive voltage is applied to the drain side.

In the cross-sectional views illustrating the impact ionization rate, the lighter-colored (white) regions of the semiconductor substrate S indicate a higher impact ionization rate. In the semiconductor device 190 illustrated in FIG. 7B, the impact ionization rate is high in a region R10 at the outermost periphery of the third semiconductor region 23. It is considered that when depletion occurs at the outermost third semiconductor region 23, the electric field intensity and the impact ionization rate increase at the periphery of the outermost third semiconductor region 23. Thus, when the outward spreading of the depletion layer in the termination region R2 increases, the electric field at the outer perimeter of the termination region R2 increases. In such a case, the breakdown voltage of the termination region R2 may degrade, and the breakdown voltage of the semiconductor device may degrade.

On the other hand, in the semiconductor device 110 illustrated in FIG. 7D, the electric field and the impact ionization rate are high in a region R11 at the periphery of the third semiconductor region 23 located inward in the termination region R2. In the semiconductor device 110, the outward spreading of the depletion layer in the termination region R2 can be suppressed, and an increase of the electric field at the outer perimeter of the termination region R2 can be suppressed. For example, the degradation of the breakdown voltage of the semiconductor device can be suppressed thereby. For example, in the case where the depletion layer does not spread to the outer perimeter of the termination region R2, the structure of the portion of the termination region R2 at the outer perimeter can be omitted. The semiconductor device can be smaller thereby.

According to the embodiment, for example, the pitch of the multiple third semiconductor regions 23 in the termination region R2 increases at a prescribed ratio away from the element region R1 in the X-direction. In other words, for example, in the example of FIG. 2, the ratio of the pitch P232 to the pitch P231 is a prescribed first ratio; and the ratio of the pitch P232 to the pitch P233 is the first ratio. The first ratio is greater than 1, e.g., 1.01 to 1.03. Or, for example, the pitch of the multiple third semiconductor regions 23 in the termination region R2 may increase by a prescribed length away from the element region R1 in the X-direction. In other words, for example, in the example of FIG. 2, the pitch P232 may be greater than the pitch P231 by a prescribed first length; and the pitch P233 may be greater than the pitch P232 by the first length. Thus, an abrupt change of the electric field intensity along the X-direction can be suppressed by gradually increasing the pitch of the third semiconductor regions 23.

For example, the balance between the n-type impurity amount and the p-type impurity amount in the element region R1 is adjusted by setting the pitch of the third semiconductor regions 23 in the element region R1 to be constant. The pitch of the third semiconductor regions 23 in the termination region R2 is greater than the pitch of the third semiconductor regions 23 in the element region R1. For example, the width W1 in the X-direction of the third semiconductor region 23 in the termination region R2 is less than a distance L1 between the third semiconductor regions 23 adjacent to each other in the termination region R2 (see FIG. 2). The n-type impurity amount increases and the outward spreading of the depletion layer in the termination region R2 is suppressed outward in the termination region R2. For example, the pitch of the third semiconductor regions 23 at the innermost side (the element region R1 side) of the termination region R2 may be equal to the pitch of the third semiconductor regions 23 in the element region R1.

For example, similarly to the multiple third semiconductor regions 23, the pitch of the multiple fourth semiconductor regions 24 in the termination region R2 may increase at a prescribed ratio away from the element region R1 in the X-direction. Or, for example, similarly to the multiple third semiconductor regions 23, the pitch of the multiple fourth semiconductor regions 24 in the termination region R2 may increase by a prescribed length away from the element region R1 in the X-direction.

In the example illustrated in FIG. 2, the distance D24 is equal to the distance D23. In other words, the depth of the first trench T1 described with reference to FIGS. 3A and 4A is equal to the depth of the second trench T2. The configuration is not limited thereto; for example, the distance D24 may be greater than the distance D23. For example, the on-resistance can be reduced when the fourth semiconductor region 24 is long in the Z-direction.

Embodiments may include the following configurations.

Configuration 1

A semiconductor device including an element region and a termination region, the termination region surrounding the element region, the device comprising:

a first electrode located in the element region and the termination region;

a first semiconductor region located on the first electrode, the first semiconductor region being of a first conductivity type;

a second semiconductor region located on the first semiconductor region, the second semiconductor region including a first part and a plurality of second parts, the plurality of second parts being located on portions of the first part, the second semiconductor region being of the first conductivity type and having a lower first-conductivity-type impurity concentration than the first semiconductor region;

a plurality of third semiconductor regions located on other portions of the first part, the plurality of third semiconductor regions being arranged in a second direction perpendicular to a first direction, the first direction being from the first electrode toward the first semiconductor region, a pitch in the termination region of the plurality of third semiconductor regions increasing away from the element region in the second direction, the plurality of third semiconductor regions being of a second conductivity type;

a plurality of fourth semiconductor regions separated from the third semiconductor regions in the second direction with the second parts interposed, the plurality of fourth semiconductor regions being alternately arranged with the plurality of third semiconductor regions in the second direction, the plurality of fourth semiconductor regions being of the first conductivity type and a higher first-conductivity-type impurity having concentration than the second semiconductor region;

a fifth semiconductor region located on at least one of the third semiconductor regions in the element region, the fifth semiconductor region being of the second conductivity type;

a sixth semiconductor region located on the fifth semiconductor region, the sixth semiconductor region being separated from the second part with a portion of the fifth semiconductor region interposed, the sixth semiconductor region being of the first conductivity type;

a gate electrode facing the portion of the fifth semiconductor region via a gate insulating layer; and a second electrode located on the fifth and sixth semiconductor regions, the second electrode being electrically connected with the fifth and sixth semiconductor regions.

Configuration 2

The device according to Configuration 1, wherein the pitch in the termination region of the plurality of third semiconductor regions increases at a prescribed ratio away from the element region in the second direction.

Configuration 3

The device according to Configuration 1, wherein the pitch in the termination region of the plurality of third semiconductor regions increases by a prescribed length away from the element region in the second direction.

Configuration 4

The device according to any one of Configurations 1 to 3, wherein a pitch in the element region of the plurality of third semiconductor regions is constant.

Configuration 5

The device according to any one of Configurations 1 to 4, wherein the pitch in the termination region of the plurality of third semiconductor regions is greater than a pitch in the element region of the plurality of third semiconductor regions.

Configuration 6

The device according to any one of configurations 1 to 5, wherein in the termination region, widths in the second direction of the third semiconductor regions are less than a distance between the third semiconductor regions that are adjacent to each other.

Configuration 7

The device according to any one of Configurations 1 to 6, wherein in the element region, widths in the second direction of the third semiconductor regions are less than a distance between the third semiconductor regions that are adjacent to each other.

Configuration 8

The device according to any one of Configurations 1 to 6, wherein in the element region, widths in the second direction of the third semiconductor regions are equal to a distance between the third semiconductor regions that are adjacent to each other.

Configuration 9

The device according to any one of Configurations 1 to 8, wherein a second-conductivity-type impurity concentration in the third semiconductor region is greater than the first-conductivity-type impurity concentration in the second semiconductor region.

Configuration 10

A method for manufacturing a semiconductor device, the device including an element region and a termination region, the termination region surrounding the element region, the method comprising:

forming a plurality of first trenches in an upper surface of a second semiconductor region, the second semiconductor region being located on a first semiconductor region of a first conductivity type and located in the element region and the termination region, the second semiconductor region having a lower first-conductivity-type impurity concentration than the first semiconductor region, the plurality of first trenches being arranged in a second direction perpendicular to a first direction, the first direction being toward the first semiconductor region, a pitch in the termination region of the plurality of first trenches increasing away from the element region in the second direction;

forming a plurality of third semiconductor regions in the plurality of first trenches, the plurality of third semiconductor regions being of a second conductivity type, a second-conductivity-type impurity concentration of the plurality of third semiconductor regions being greater than a first-conductivity-type impurity concentration of the second semiconductor region;

forming a plurality of second trenches in the upper surface of the second semiconductor region, the plurality of second trenches being alternately arranged with positions at which the plurality of first trenches is located in the second direction, the plurality of second trenches being separated in the second direction from the first trenches;

forming a plurality of fourth semiconductor regions in the plurality of second trenches, the plurality of fourth semiconductor regions being of the first conductivity type and having a higher first-conductivity-type impurity concentration than the second semiconductor region;

forming a gate insulating layer and a gate electrode above the second semiconductor region in the element region;

forming a fifth semiconductor region on at least one of the third semiconductor regions in the element region, a portion of the fifth semiconductor region facing the gate electrode via the gate insulating layer, the fifth semiconductor region being of the second conductivity type;

forming a sixth semiconductor region on the fifth semiconductor region, the sixth semiconductor region being adjacent to the portion of the fifth semiconductor region and separated from the second semiconductor region, the sixth semiconductor region being of the first conductivity type; and forming a first electrode electrically connected with the first semiconductor region, and a second electrode electrically connected with the fifth and sixth semiconductor regions.

According to embodiments, a semiconductor device and a method for manufacturing a semiconductor device can be provided in which the degradation of the breakdown voltage can be suppressed.

In the embodiments above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. The relative levels of the impurity concentrations between the semiconductor regions can be considered to correspond to the relative levels of the carrier concentrations between the semiconductor regions. Accordingly, the relative levels of the carrier concentrations between the semiconductor regions also can be confirmed using SCM. Also, the impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

The scope of one component being "located on" another component may include not only the case where the two components contact each other, but also the case where another component is located between the two components. For example, the scope of one component being "located on" another component may include the case where one component is positioned above another component regardless of whether or not the two components contact each other (or are continuous).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device including an element region and a termination region, the termination region surrounding the element region, the device comprising:

a first electrode located in the element region and the termination region;

a first semiconductor region located on the first electrode, the first semiconductor region being of a first conductivity type;

a second semiconductor region located on the first semiconductor region, the second semiconductor region including a first part and a plurality of second parts, the plurality of second parts being located on portions of the first part, the second semiconductor region being of the first conductivity type and having a lower first-conductivity-type impurity concentration than the first semiconductor region;

a plurality of third semiconductor regions located on other portions of the first part, the plurality of third semiconductor regions being arranged in a second direction perpendicular to a first direction, the first direction being from the first electrode toward the first semiconductor region, a pitch in the termination region of the plurality of third semiconductor regions increasing away from the element region in the second direction, the plurality of third semiconductor regions being of a second conductivity type;

a plurality of fourth semiconductor regions separated from the third semiconductor regions in the second direction with the second parts interposed, the plurality of fourth semiconductor regions being alternately arranged with the plurality of third semiconductor regions in the second direction, the plurality of fourth semiconductor regions being of the first conductivity type and having a higher first-conductivity-type impurity concentration than the second semiconductor region;

a fifth semiconductor region located on at least one of the third semiconductor regions in the element region, the fifth semiconductor region being of the second conductivity type;

a sixth semiconductor region located on the fifth semiconductor region, the sixth semiconductor region being separated from the second part with a portion of the fifth semiconductor region interposed, the sixth semiconductor region being of the first conductivity type;

a gate electrode facing the portion of the fifth semiconductor region via a gate insulating layer; and a second electrode located on the fifth and sixth semiconductor regions, the second electrode being electrically connected with the fifth and sixth semiconductor regions.

2. The device according to claim 1, wherein the pitch in the termination region of the plurality of third semiconductor regions increases at a prescribed ratio away from the element region in the second direction.

3. The device according to claim 1, wherein the pitch in the termination region of the plurality of third semiconductor regions increases by a prescribed length away from the element region in the second direction.

4. The device according to claim 1, wherein a pitch in the element region of the plurality of third semiconductor regions is constant.

5. The device according to claim 1, wherein the pitch in the termination region of the plurality of third semiconductor regions is greater than a pitch in the element region of the plurality of third semiconductor regions.

6. The device according to claim 1, wherein in the element region, widths in the second direction of the third semiconductor regions are less than a distance between the third semiconductor regions that are adjacent to each other.

7. The device according to claim 1, wherein in the element region, widths in the second direction of the third semiconductor regions are equal to a distance between the third semiconductor regions that are adjacent to each other.

8. The device according to claim 1, wherein a second-conductivity-type impurity concentration in the third semiconductor region is greater than the first-conductivity-type impurity concentration in the second semiconductor region.

* * * * *